(12) United States Patent
Ishihara

(10) Patent No.: US 12,230,203 B2
(45) Date of Patent: Feb. 18, 2025

(54) DISPLAY APPARATUS

(71) Applicant: Japan Display Inc., Tokyo (JP)

(72) Inventor: Tomoyuki Ishihara, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 18/234,041

(22) Filed: Aug. 15, 2023

(65) Prior Publication Data

US 2023/0386408 A1 Nov. 30, 2023

Related U.S. Application Data

(63) Continuation of application No. PCT/JP2022/002957, filed on Jan. 26, 2022.

(30) Foreign Application Priority Data

Feb. 22, 2021 (JP) .................................. 2021-026722

(51) Int. Cl.
*G09G 3/3233* (2016.01)
*G09G 3/20* (2006.01)

(52) U.S. Cl.
CPC ......... *G09G 3/3233* (2013.01); *G09G 3/2007* (2013.01); *G09G 2300/0842* (2013.01); *G09G 2310/08* (2013.01); *G09G 2320/0626* (2013.01)

(58) Field of Classification Search
None
See application file for complete search history.

(56) References Cited

U.S. PATENT DOCUMENTS

| | | |
|---|---|---|
| 2007/0212078 A1 | 9/2007 | Jo |
| 2012/0188221 A1 | 7/2012 | Izawa et al. |
| 2020/0111403 A1 | 4/2020 | Kim et al. |
| 2020/0221554 A1 | 7/2020 | Chiang et al. |
| 2021/0012709 A1 | 1/2021 | Qian et al. |

FOREIGN PATENT DOCUMENTS

| | | |
|---|---|---|
| JP | 2007-237529 A | 9/2007 |
| JP | 2007-333768 A | 12/2007 |
| JP | 2010-097040 A | 4/2010 |
| KR | 2003-0044566 A | 6/2003 |
| WO | 2009-069644 A | 4/2009 |
| WO | WO2012/063285 A1 | 5/2012 |

OTHER PUBLICATIONS

International Search Report issued in International Patent Application No. PCT/JP2022/002957 on Apr. 5, 2022 and English translation of same. 7 pages.

Written Opinion issued in International Patent Application No. PCT/JP2022/002957 on Apr. 5, 2022. 4 pages.

*Primary Examiner* — Nicholas J Lee
(74) *Attorney, Agent, or Firm* — K&L Gates LLP

(57) ABSTRACT

A display apparatus includes a light-emitting element, a first pixel circuit and a second pixel circuit coupled to the light-emitting element, a first drive transistor included in the first pixel circuit and configured to supply a first drive current to the light-emitting element, a second drive transistor included in the second pixel circuit and configured to supply a second drive current to the light-emitting element, and a drive circuit configured to supply a first video signal to the first drive transistor and to supply a second video signal to the second drive transistor. The first drive transistor is supplied with the first video signal and the second drive transistor is supplied with the second video signal in a same writing period.

17 Claims, 10 Drawing Sheets

DISPLAY APPARATUS

CROSS-REFERENCE TO RELATED APPLICATION

This application a continuation of International Patent Application No. PCT/JP2022/002957 filed on Jan. 26, 2022 which designates the United States, incorporated herein by reference, and which claims the benefit of priority from Japanese Patent Application No. 2021-026722 filed on Feb. 22, 2021, incorporated herein by reference.

BACKGROUND

1. Technical Field

The present invention relates to a display apparatus.

2. Description of the Related Art

Display devices with light-emitting elements, such as inorganic light-emitting diodes (micro LEDs) and organic light-emitting diodes (OLEDs) perform gradation control by current drive (refer to Japanese Patent Application Laid-open Publication No. 2007-333768, for example).

If a gradation (a gray scale, a gray level) is expressed only by controlling a current value, it depends on the performance of a transistor that adjusts the current value. As a result, the emission intensity may possibly vary from the desired emission intensity depending on the characteristics of the transistor that adjusts the current value. By contrast, to achieve all the gradations by a pulse width modulation system that expresses the gradation by controlling the lighting time while keeping the current value constant, it is necessary to switch on and off a switching element of a pixel circuit according to the lighting time. In addition, a drive time for causing the current value to rise to the desired current value is required, making it difficult to perform the pixel writing operation at high speed. This may possibly make it difficult to finely control gradation expression.

An object of the present invention is to provide a display apparatus that can suitably perform gradation control.

SUMMARY

A display apparatus according to an embodiment of the present disclosure includes a light-emitting element, a first pixel circuit and a second pixel circuit coupled to the light-emitting element, a first drive transistor included in the first pixel circuit and configured to supply a first drive current to the light-emitting element, a second drive transistor included in the second pixel circuit and configured to supply a second drive current to the light-emitting element, and a drive circuit configured to supply a first video signal to the first drive transistor and to supply a second video signal to the second drive transistor. The first drive transistor is supplied with the first video signal and the second drive transistor is supplied with the second video signal in a same writing period, and the first drive transistor supplies the first drive current to the light-emitting element and the second drive transistor supplies the second drive current to the light-emitting element in a time-division manner.

A display apparatus according to an embodiment of the present disclosure includes a light-emitting element, a first pixel circuit and a second pixel circuit coupled to the light-emitting element, a first drive transistor included in the first pixel circuit and configured to supply a first drive current to the light-emitting element, a second drive transistor included in the second pixel circuit and configured to supply a second drive current to the light-emitting element, a first light emission control transistor coupled to the first drive transistor, a first light emission control scanning line coupled to a gate of the first light emission control transistor, a first coupling switching transistor provided between the first drive transistor and the light-emitting element, a second light emission control transistor coupled to the second drive transistor, a second light emission control scanning line coupled to a gate of the second light emission control transistor, and a drive circuit configured to supply a first video signal to the first drive transistor and to supply a second video signal to the second drive transistor. A gate of the first coupling switching transistor is coupled to one of the first light emission control scanning line and the second light emission control scanning line.

A display apparatus according to an embodiment of the present disclosure includes a light-emitting element, a first pixel circuit and a second pixel circuit coupled to the light-emitting element, a first drive transistor included in the first pixel circuit and configured to supply a first drive current to the light-emitting element, a second drive transistor included in the second pixel circuit and configured to supply a second drive current to the light-emitting element, and a drive circuit configured to supply a first video signal to the first drive transistor and to supply a second video signal to the second drive transistor. The first drive current changes depending on a gray level of the first video signal, and the second drive current is a constant current value.

DETAILED DESCRIPTION

Figure 1:
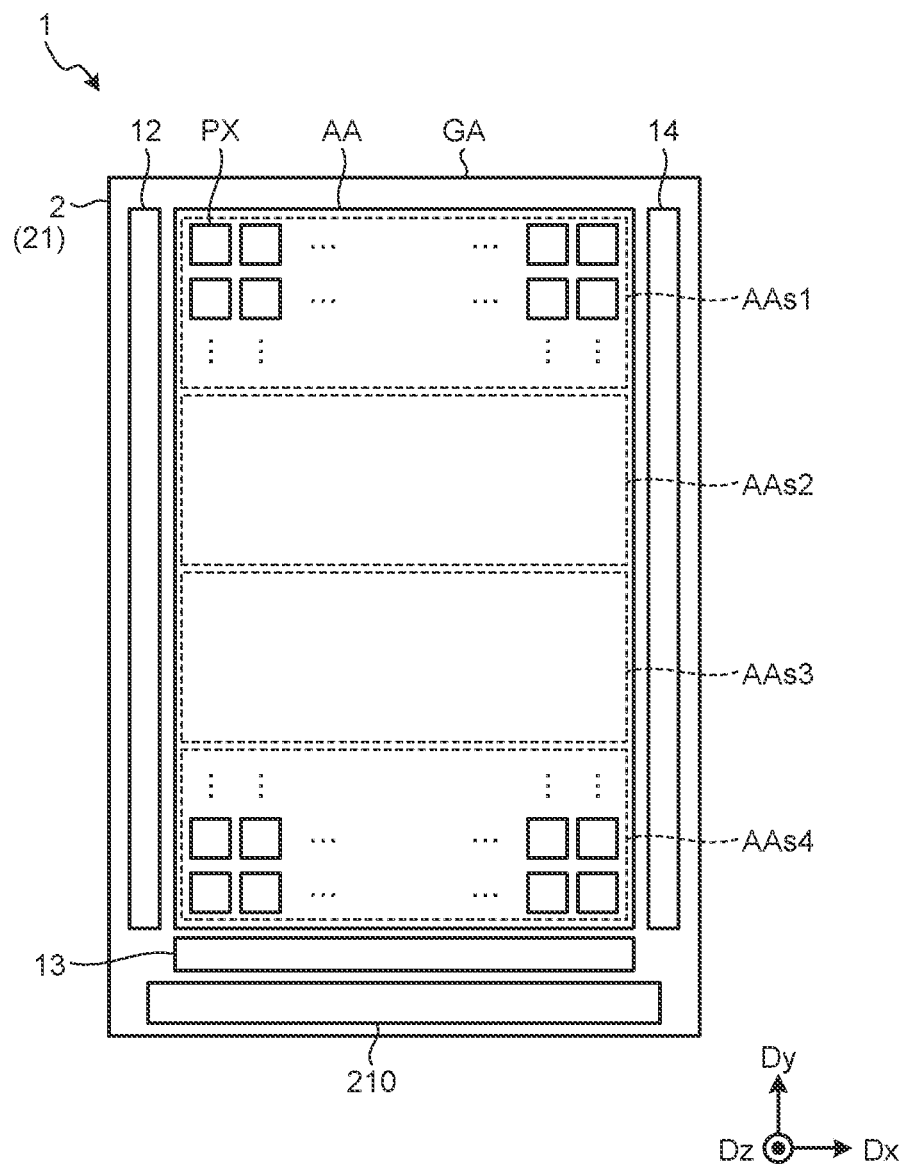
FIG. 1 is a plan view of a display apparatus according to a first embodiment.

Exemplary aspects (embodiments) to embody the present invention are described below in greater detail with reference to the accompanying drawings. The contents described in the embodiments below are not intended to limit the present disclosure. Components described below include components easily conceivable by those skilled in the art and components substantially identical therewith. Furthermore, the components described below may be appropriately combined. What is disclosed herein is given by way of example only, and appropriate modifications made without departing from the spirit of the present disclosure and easily conceivable by those skilled in the art naturally fall within the scope of the present disclosure. To simplify the explanation, the drawings may possibly illustrate the width, the thickness, the shape, and other elements of each unit more schematically than the actual aspect. These elements, however, are given by way of example only and are not intended to limit interpretation of the present disclosure. In the present disclosure and the drawings, components similar to those previously described with reference to previous drawings are denoted by like reference numerals, and detailed explanation thereof may be appropriately omitted.

To describe an aspect where a first structure is disposed on a second structure in the present specification and the claims, the term "on" includes both of the following cases unless otherwise noted: a case where the first structure is disposed directly on the second structure in contact with the second structure, and a case where the first structure is disposed on the second structure with another structure interposed therebetween.

First Embodiment

FIG. 1 is a plan view of a display apparatus according to a first embodiment. A display apparatus 1 according to the present embodiment is an organic EL display apparatus with organic light-emitting diodes (OLEDs) serving as self-light-emitting elements. As illustrated in FIG. 1, the display apparatus 1 includes an array substrate 2, a plurality of pixels PX, a scanning line drive circuit 12, a signal line drive circuit 13, a light emission control circuit 14, and a drive integrated circuit (IC) 210.

The array substrate 2 is a drive circuit substrate that drives the pixels PX and is also called a backplane or an active matrix substrate. The array substrate 2 is composed of a substrate 21 serving as a base and includes a plurality of transistors, a plurality of capacitances, various kinds of wiring, and other components on the substrate 21. A wiring substrate (e.g., flexible printed circuits (FPC)) or the like, which is not specifically illustrated, may be coupled on the array substrate 2 to receive various control signals and electric power from an external control substrate.

In the following description, a first direction Dx is one direction in a plane parallel to the substrate 21. A second direction Dy is one direction in the plane parallel to the substrate 21 and is orthogonal to the first direction Dx. The second direction Dy may intersect the first direction Dx without being orthogonal thereto. A third direction Dz is orthogonal to the first direction Dx and the second direction Dy and is the normal direction of the substrate 21. "Plan view" indicates the positional relation viewed from the third direction Dz.

The scanning line drive circuit 12 is a drive circuit that supplies writing control signals SG to scanning lines (writing control scanning lines GL (refer to FIG. 4)) in a display region AA to drive the pixels PX. The signal line drive circuit 13 is a drive circuit that supplies video signals VSG to signal lines (first video signal lines SL1 and second video signal lines SL2 (refer to FIG. 4)) in the display region AA to drive the pixels PX. The light emission control circuit 14 is a drive circuit that supplies signals to scanning lines (first light emission control scanning lines PWL1 and second light emission control scanning lines PWL2 (refer to FIG. 4)) in the display region AA to drive the pixels PX.

The drive IC 210 is a circuit that supplies control signals to the scanning line drive circuit 12, the signal line drive circuit 13, and the light emission control circuit 14 to control display of the pixels PX. At least part of the scanning line drive circuit 12, the signal line drive circuit 13, and the light emission control circuit 14 may be formed integrally with the drive IC 210. The drive IC 210 is provided on the array substrate 2. The configuration is not limited thereto, and the drive IC 210 may be provided to the wiring substrate coupled to the array substrate 2.

The array substrate 2 has the display region AA and a peripheral region GA. The display region AA is provided with the pixels PX. The pixels PX are arrayed in a matrix (row-column configuration) in the display region AA. The peripheral region GA is a region outside the display region AA and is not provided with the pixels PX. The peripheral region GA is provided with the scanning line drive circuit 12, the signal line drive circuit 13, the light emission control circuit 14, and the drive IC 210. The scanning line drive circuit 12 and the light emission control circuit 14 are provided in a region extending along the second direction Dy in the peripheral region GA. The signal line drive circuit 13 and the drive IC 210 are provided in a region extending along the first direction Dx in the peripheral region GA. More specifically, the scanning line drive circuit 12 is provided along the left side of the display region AA, and the light emission control circuit 14 is provided along the right side of the display region AA with respect to the display region AA in FIG. 1. The signal line drive circuit 13 and the drive IC 210 are provided along the lower side of the display region AA. The scanning line drive circuit 12 and the light emission control circuit 14 may be provided in a region along the same side of the peripheral region GA.

The following describes an example where the display region AA is divided into four parts of a first partial display region AAs1, a second partial display region AAs2, a third partial display region AAs3, and a fourth partial display region AAs4 (refer to FIG. 5), and the display apparatus 1 performs the display operation on each of the partial display regions.

To simplify the explanation, the display region AA according to the present embodiment has a rectangular shape, and the peripheral region GA has a rectangular frame shape surrounding the display region AA. The shapes are not limited thereto, and the display region AA may have a polygonal shape or an irregular shape with cutouts (notches) or curved portions in part of the outer periphery. The peripheral region GA may also have various different shapes corresponding to the shape of the display region AA.

Figure 2:
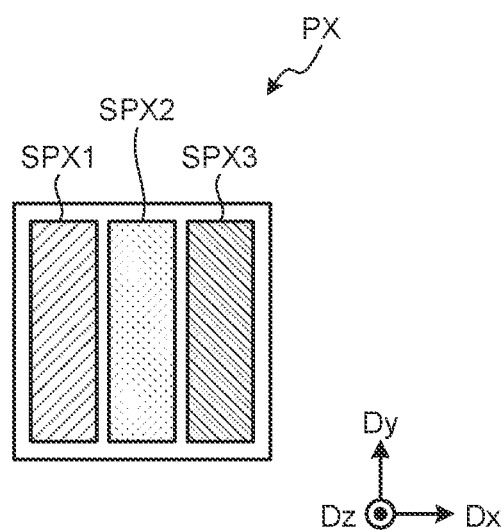
FIG. 2 is a plan view of an example of a pixel of the display apparatus according to the first embodiment.

FIG. 2 is a plan view of an example of the pixel of the display apparatus according to the first embodiment. As illustrated in FIG. 2, the pixel PX includes a first sub-pixel SPX1, a second sub-pixel SPX2, and a third sub-pixel SPX3. The first sub-pixel SPX1, the second sub-pixel SPX2, and the third sub-pixel SPX3 each include an organic light-emitting diode as a light-emitting element 100 (refer to FIG. 4). In the following description, the first sub-pixel SPX1, the second sub-pixel SPX2, and the third sub-pixel SPX3 are simply referred to as sub-pixels SPX when they need not be distinguished from each other.

The first sub-pixel SPX1 displays red (R), for example. The second sub-pixel SPX2 displays green (G), for example. The third sub-pixel SPX3 displays blue (B), for example. The first sub-pixel SPX1, the second sub-pixel SPX2, and the third sub-pixel SPX3 are adjacently disposed in the first direction Dx. The configuration is not limited thereto, and the pixel PX may have other arrangements. For example, the first sub-pixel SPX1 and the second sub-pixel SPX2 may be adjacently disposed in the second direction Dy, and one third sub-pixel SPX3 may be disposed adjacently to the first sub-pixel SPX1 and the second sub-pixel SPX2 adjacently disposed in the second direction Dy. The pixel PX may be configured in what is called the PenTile arrangement. The pixel PX is not necessarily composed of three sub-pixels SPX and may be composed of four or more sub-pixels SPX.

Figure 3:
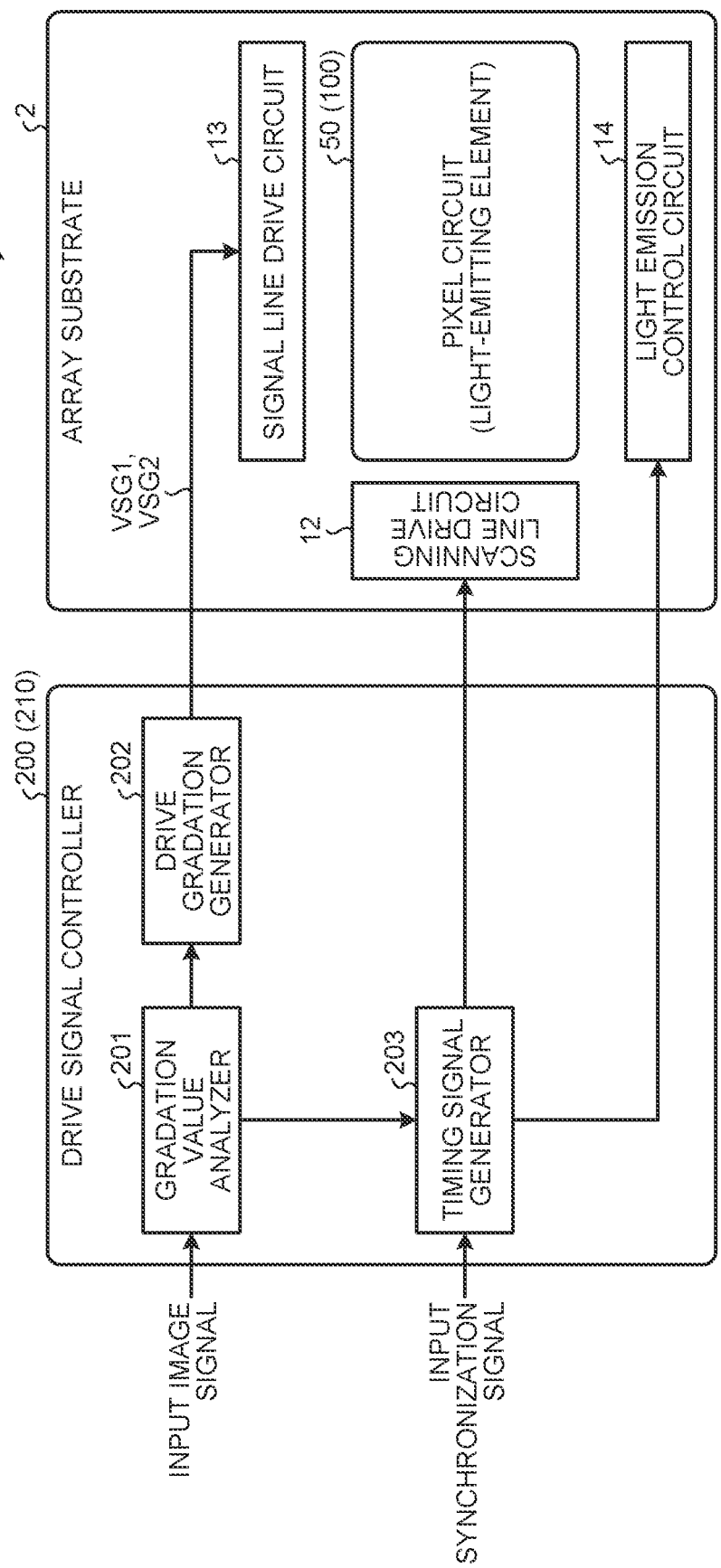
FIG. 3 is a block diagram of an exemplary configuration of the display apparatus according to the first embodiment.

The following describes gradation control performed by the display apparatus 1. FIG. 3 is a block diagram of an exemplary configuration of the display apparatus according to the first embodiment. As illustrated in FIG. 3, the display apparatus 1 includes a pixel circuit 50 and a drive signal controller 200 that controls the drive of the pixel circuit 50. The pixel circuit 50 is a circuit that supplies drive signals (electric current) to the light-emitting element 100 to drive the light-emitting element 100. While one pixel circuit 50 (light-emitting element 100) is schematically illustrated in FIG. 3, a plurality of pixel circuits 50 and a plurality of light-emitting elements 100 are provided to the respective sub-pixels SPX (refer to FIG. 2) and are arrayed in a matrix (row-column configuration) in the display region AA.

The drive signal controller 200 includes a gradation value analyzer 201, a drive gradation generator 202, and a timing signal generator 203. The gradation value analyzer 201 is a circuit that calculates a gradation value (a gray scale value, a gray level value) for each pixel PX (sub-pixel SPX) based on image signals input from an external control circuit. The gradation value may be hereinafter referred to as a target luminance level.

The drive gradation generator 202 is a circuit that generates first video signals VSG1 and second video signals VSG2 based on the target luminance level received from the gradation value analyzer 201. The signal line drive circuit 13 of the array substrate 2 outputs the first video signals VSG1 and the second video signals VSG2 supplied from the drive gradation generator 202 to the pixel circuits 50 to drive the pixels PX at the target luminance level. In the following description, the first video signal VSG1 and the second video signal VSG2 may be simply referred to as video signals VSG when they need not be distinguished from each other.

The timing signal generator 203 generates timing signals based on synchronization signals input from the external control circuit and the target luminance level received from the gradation value analyzer 201. The scanning line drive circuit 12 and the light emission control circuit 14 output control signals (writing control signals SG and light emission control signals PG) to the pixel circuits 50 based on the timing signals (control signals) supplied from the timing signal generator 203.

The first video signal VSG1 and the second video signal VSG2 have a predetermined signal potential to turn on the optical element 100. The timing signal (control signal) supplied from the timing signal generator 203 includes information on the lighting period of the light-emitting element 100 by the light emission control circuit 14. The display apparatus 1 can perform multi-gradation display by combining a system that expresses the gradation by controlling the value of an electric current supplied to the optical element 100 of each sub-pixel SPX (hereinafter referred to as a current drive system or an analog drive system) and a system that expresses the gradation by controlling the lighting time of the optical element 100 while keeping the value of an electric current supplied thereto constant (hereinafter referred to as a PWM drive system). The drive signal controller 200 may be formed integrally with the drive IC 210 or may be provided to the external control circuit.

Figure 4:
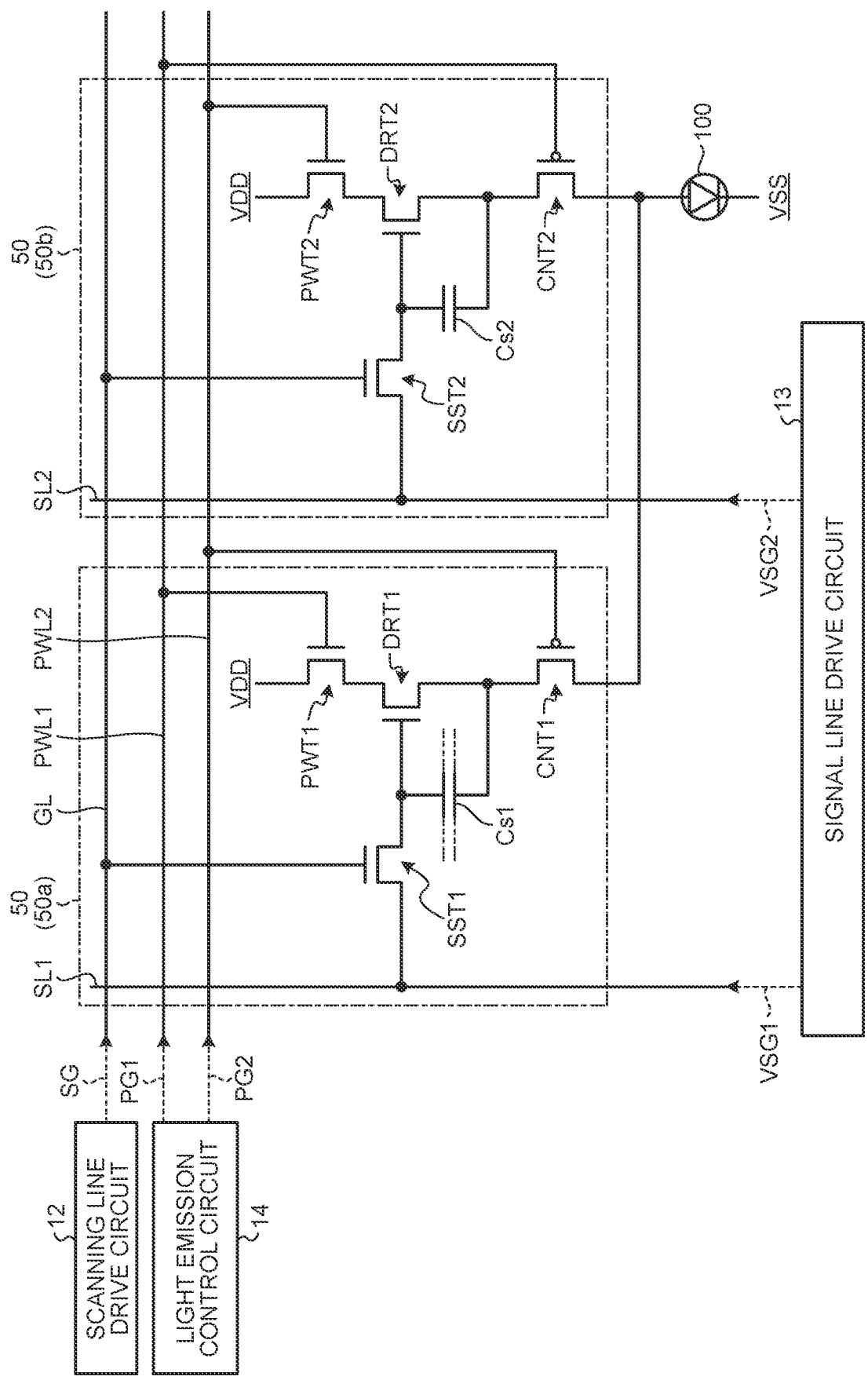
FIG. 4 is a circuit diagram of an exemplary configuration of a pixel circuit.

FIG. 4 is a circuit diagram of an exemplary configuration of the pixel circuit. As illustrated in FIG. 4, the pixel circuit 50 includes a first pixel circuit 50a and a second pixel circuit 50b. The first pixel circuit 50a and the second pixel circuit 50b are coupled to one light-emitting element 100. In other words, the first pixel circuit 50a and the second pixel circuit 50b are provided to each of the sub-pixels SPX. The first pixel circuit 50a is a circuit that drives the light-emitting element 100 by the current drive system. The first pixel circuit 50a can also serve as a circuit that drives the light-emitting element 100 by the PWM drive system in part of a frame period for displaying an image of one screen. The second pixel circuit 50b is a circuit that drives the light-emitting element 100 by the PWM drive system.

The first pixel circuit 50a includes a first light emission control transistor PWT1, a first writing transistor SST1, a first drive transistor DRT1, and a first coupling switching transistor CNT1. The gate of the first light emission control transistor PWT1 is coupled to the first light emission control scanning line PWL1. One of the source and the drain of first light emission control transistor PWT1 is coupled to a power supply voltage VDD. The other of the source and the drain of the first light emission control transistor PWT1 is coupled to the first drive transistor DRT1. When the first light emission control transistor PWT1 is turned on (coupled state), the power supply voltage VDD is supplied to the first drive transistor DRT1.

The gate of the first writing transistor SST1 is coupled to the writing control scanning line GL. The source or the drain of the first writing transistor SST1 is coupled to the first video signal line SL1. The other of the source and the drain of the first writing transistor SST1 is coupled to the gate of the first drive transistor DRT1. When the first writing transistor SST1 is turned on (coupled state), the first video signal VSG1 is supplied from the signal line drive circuit 13 to the gate of the first drive transistor DRT1. The ON state of the drive transistor DRT varies depending on the magnitude of the first video signal VSG1. For example, if the first video signal VSG1 corresponds to a signal potential that achieves the maximum luminance of the light-emitting element 100, the drive transistor DRT is substantially completely turned on according to the electric potential. As a result, an electric current (predetermined fixed potential) from the power supply voltage VDD passes through the drive transistor DRT substantially without any change and is supplied to the light-emitting element 100. By contrast, if the first video signal VSG1 corresponds to the lowest luminance of the light-emitting element 100, that is, a signal potential that displays black, the drive transistor DRT is turned off, and the electric current from the power supply voltage VDD is not supplied to the light-emitting element 100.

The first video signal VSG1 can also have signal potentials between the maximum luminance and the lowest luminance. When the signal potential is supplied to the drive transistor DRT, the drive transistor DRT is turned on by the magnitude corresponding to the signal potential. As a result, the electric current from the power supply voltage VDD is supplied to the light-emitting element 100 only by the amount corresponding to the ON state of the drive transistor DRT.

The gate of the first coupling switching transistor CNT1 is coupled to the second light emission control scanning line PWL2. One of the source and the drain of the first coupling switching transistor CNT1 is coupled to the first drive transistor DRT1. The other of the source and the drain of the first coupling switching transistor CNT1 is coupled to the light-emitting element 100. In other words, the first coupling switching transistor CNT1 is coupled between the first drive transistor DRT1 and the light-emitting element 100.

The writing control scanning line GL is coupled to the scanning line drive circuit 12. The scanning line drive circuit 12 supplies the writing control signals SG to the writing control scanning line GL. The first light emission control scanning line PWL1 and the second light emission control scanning line PWL2 are coupled to the light emission control circuit 14. The light emission control circuit 14 supplies first light emission control signals PG1 and second light emission control signals PG2 to the first light emission control scanning line PWL1 and the second light emission control scanning line PWL2, respectively.

The transistors (the first light emission control transistor PWT1, the first writing transistor SST1, and the first drive transistor DRT1) included in the first pixel circuit 50a are n-type thin-film transistors (TFTs). The first coupling switching transistor CNT1 is a p-type TFT. When the electric potential of the first light emission control scanning line PWL1 is turned to a high (H) level, and the electric potential of the second light emission control scanning line PWL2 is turned to a low (L) level, the first coupling switching transistor CNT1 is turned on (coupled state) in synchronization with the first light emission control transistor PWT1. Alternatively, when the electric potential of the first light emission control scanning line PWL1 is turned to the L level, and the electric potential of the second light emission control scanning line PWL2 is turned to the H level, the first coupling switching transistor CNT1 is turned off (uncoupled state) in synchronization with the first light emission control transistor PWT1.

The first pixel circuit 50a includes holding capacitance Cs1. The holding capacitance Cs1 is capacitance formed between the gate and the source of the first drive transistor DRT1.

The second pixel circuit 50b includes a second light emission control transistor PWT2, a second writing transistor SST2, a second drive transistor DRT2, and a second coupling switching transistor CNT2. The second pixel circuit 50b has a configuration similar to that of the first pixel circuit 50a, and redundant explanation thereof is omitted. The gate of the second light emission control transistor PWT2 is coupled to the second light emission control scanning line PWL2. When the second light emission control transistor PWT2 is turned on (coupled state), the power supply voltage VDD is supplied to the second drive transistor DRT2.

The gate of the second writing transistor SST2 is coupled to the writing control scanning line GL. In other words, the first writing transistor SST1 and the second writing transistor SST2 are coupled to the common writing control scanning line GL. When the second writing transistor SST2 is turned on (coupled state), the second video signal VSG2 is supplied from the signal line drive circuit 13 to the gate of the second drive transistor DRT2.

The gate of the second coupling switching transistor CNT2 is coupled to the first light emission control scanning line PWL1. One of the source and the drain of the second coupling switching transistor CNT2 is coupled to the second drive transistor DRT2. The other of the source and the drain of the second coupling switching transistor CNT2 is coupled to the light-emitting element 100. In other words, the second coupling switching transistor CNT2 is coupled between the second drive transistor DRT2 and the light-emitting element 100.

The second pixel circuit 50b includes holding capacitance Cs2. The holding capacitance Cs2 is capacitance formed between the gate and the source of the second drive transistor DRT2.

Figure 5:
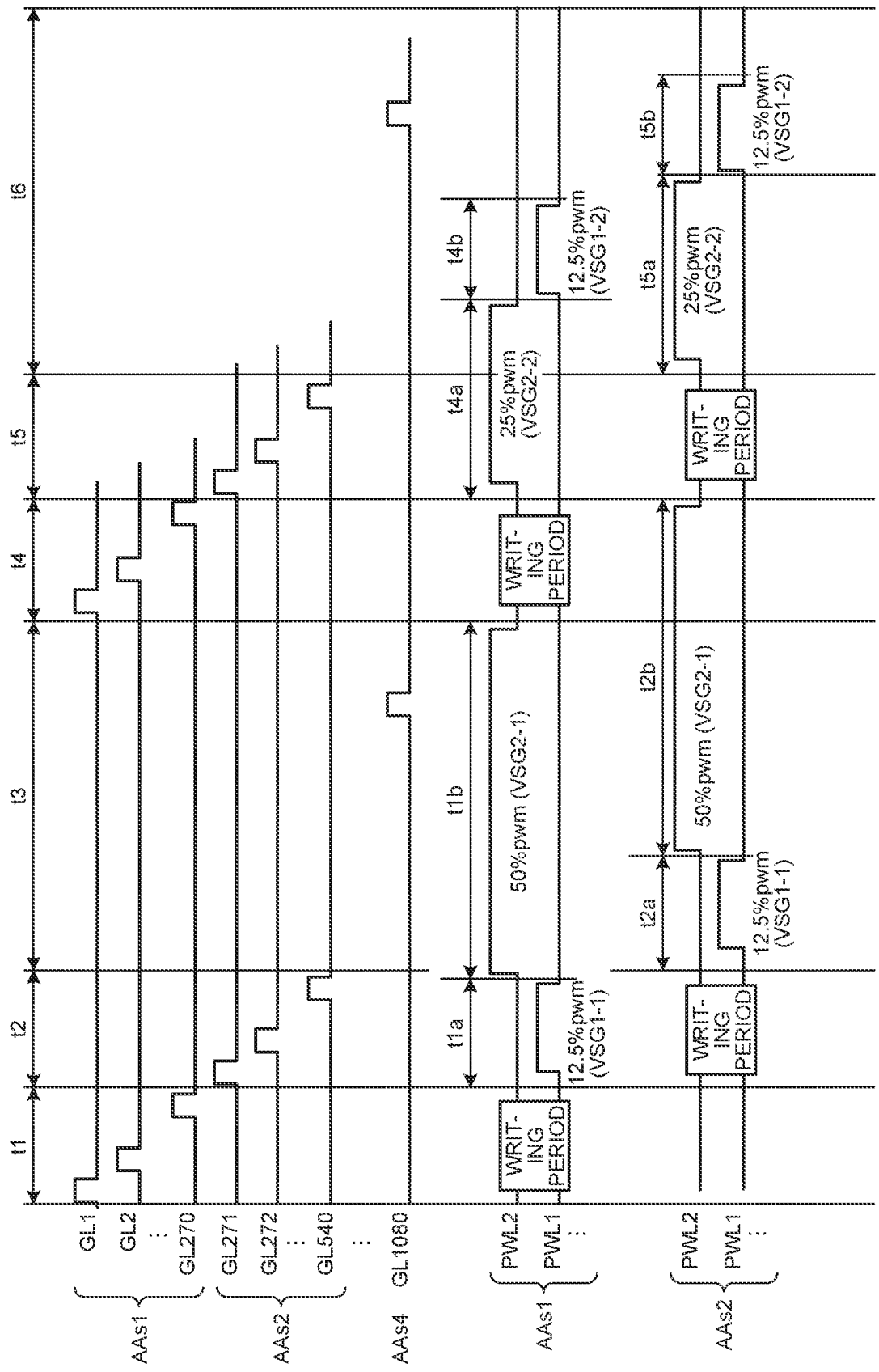
FIG. 5 is a timing chart for explaining an example of the operations performed by the display apparatus according to the first embodiment.

FIG. 5 is a timing chart for explaining an example of the operations performed by the display apparatus according to the first embodiment. While FIG. 5 illustrates the operation of driving the sub-pixels SPX in the first partial display region AAs1 and the second partial display region AAs2, the sub-pixels SPX in the third partial display region AAs3 to those in the last row are continuously driven. In the following description, the period for driving the sub-pixels SPX in the first row to those in the last row is referred to as a frame period.

As illustrated in FIG. 5, a period t1 is a video signal writing operation period for the first partial display region AAs1. Specifically, in the period t1, the electric potentials of the first light emission control scanning line PWL1 and the second light emission control scanning line PWL2 are turned to the L level, and the writing control scanning lines GL1, GL2, . . . , and GL270 are turned to the H level by the control signals supplied from the scanning line drive circuit 12 and the light emission control circuit 14.

As a result, the first light emission control transistor PWT1 of the first pixel circuit 50a and the second light emission control transistor PWT2 of the second pixel circuit 50b are turned off. The first writing transistor SST1 of the first pixel circuit 50a and the second writing transistor SST2 of the second pixel circuit 50b are turned on. In the period t1, the writing control scanning lines GL belonging to the first partial display region AAs1 are sequentially scanned. The writing control scanning line GL1 is the writing control scanning line GL1 coupled to the sub-pixels SPX in the first row, and the writing control scanning line GL2 is the writing control scanning line GL2 coupled to the sub-pixels SPX in the second row. The first partial display region AAs1 is the region including the writing control scanning lines GL1 to GL270, for example.

In the period t1, a first video signal VSG1-1 is input to the gate of the first drive transistor DRT1 of the first pixel circuit 50a in the sub-pixels SPX belonging to the writing control scanning line GL at the H level. In the same period, a second video signal VSG2-1 is input to the gate of the second drive transistor DRT2 of the second pixel circuit 50b. The gate potential of the first drive transistor DRT1 changes to the electric potential of the first video signal VSG1-1 by the video signal writing operation in the period t1. The gate potential of the second drive transistor DRT2 changes to the electric potential of the second video signal VSG2-1. As illustrated in FIG. 5, the display based on the video signals following the period t1 is performed by what is called a pulse width modulation system in both periods t1a and t1b (display drive by the pulse width modulation system is hereinafter referred to as the PWM drive system). The PWM drive system is a system that expresses the gradation of the light-emitting element 100 according to the length of the pulse width of the signals output from the light emission control circuit 14 to each of the light emission control scanning lines PWL. When the light-emitting element 100 is turned on by the PWM drive system, the brightness is preferably the maximum luminance of the light-emitting element 100. Therefore, all the video signals input in the period t1 according to the present embodiment are what is called signals (signal potentials) corresponding to the maximum luminance of the light-emitting element 100. Thus, the gradation of the light-emitting element 100 is controlled by either the maximum luminance or a luminance of 0 in the period of the PWM drive system. In the following description, the video signal supplied in the display period by the PWM drive system may be referred to as a digital signal. In view of the fact that the pulse width modulation system defines the length of the lighting time of the light-emitting element 100, the PWM drive system may be hereinafter referred to as a time division modulation system.

The periods t1a and t1b are light-emitting operation periods. Specifically, in the period t1a, the first light emission control scanning line PWL1 is turned to the H level, and the second light emission control scanning line PWL2 is turned to the L level by the control signals supplied from the scanning line drive circuit 12 and the light emission control circuit 14. The writing control scanning lines GL1, GL2, . . . , and GL270 in the first partial display region AAs1 are turned to the L level.

As a result, the first light emission control transistor PWT1 of the first pixel circuit 50a is turned on, and the first writing transistor SST1 is turned off. In addition, the first coupling switching transistor CNT1 is turned on. The power supply voltage VDD is supplied to the first drive transistor DRT1 via the first light emission control transistor PWT1. The first drive transistor DRT1 supplies an electric current corresponding to the voltage between the gate and the source set in the period t1 to the light-emitting element 100. In other words, the first drive transistor DRT1 is substantially completely turned on by the video signal, and the light-emitting element 100 emits light at the maximum luminance due to the potential difference between VDD and VSS.

By contrast, focusing on the light emission period, the period (pulse width) in which the first emission control transistor PWT1 is turned on in the period t1a is set to a period for achieving a target luminance level of 12.5% with respect to the maximum lighting luminance. In the period t1a, no electric current flows from the second drive transistor DRT2 to the light-emitting element 100 because the second light emission control transistor PWT2 of the second pixel circuit 50b is turned off. The voltage between the gate and the source of the second drive transistor DRT2 is held by the holding capacitance Cs2. In the period t1a, fluctuations in voltage between the gate and the source of the second drive transistor DRT2 due to the electric current from the first drive transistor DRT1 is suppressed because the second coupling switching transistor CNT2 of the second pixel circuit 50b is turned off.

Subsequently, in the period t1b, the first light emission control scanning line PWL1 is turned to the L level, and the second light emission control scanning line PWL2 is turned to the H level by the control signals supplied from the scanning line drive circuit 12 and the light emission control circuit 14. The writing control scanning lines GL1, GL2, . . . , and GL270 in the first partial display region AAs1 are maintained at the L level.

As a result, the second light emission control transistor PWT2 of the second pixel circuit 50b is turned on, and the second writing transistor SST2 is turned off. In addition, the second coupling switching transistor CNT2 is turned on. The power supply voltage VDD is supplied to the second drive transistor DRT2 via the second light emission control transistor PWT2. The second drive transistor DRT2 supplies an electric current corresponding to the voltage between the gate and the source set in the period t1 to the light-emitting element 100. In other words, the second drive transistor DRT2 is substantially completely turned on by the digital signal, and the light-emitting element 100 emits light at the maximum luminance based on the potential difference between VDD and VSS.

By contrast, focusing on the light emission period, the period (pulse width) in which the second emission control transistor PWT2 is turned on in the period t1b is set to a period for achieving a target luminance level of 50% with respect to the maximum lighting luminance. In other words, the period t1b is longer than the period t1a, and the period t1b according to the present embodiment is four times the length of the period t1a. In the period t1b, no electric current flows from the first drive transistor DRT1 to the light-emitting element 100 because the first light emission control transistor PWT1 of the first pixel circuit 50a is turned off. In the period t1b, fluctuations in voltage between the gate and the source of the first drive transistor DRT1 due to the electric current from the second drive transistor DRT2 is suppressed because the first coupling switching transistor CNT1 of the first pixel circuit 50a is turned off.

In both the periods t1a and t1b corresponding to the light emission periods described above, the light-emitting element 100 is turned on at the maximum luminance. By contrast, the light emission period of the period t1a is shorter than that of the period 1b. Therefore, the luminance of the light-emitting element 100 can be changed by switching on and off the light-emitting element 100 in each of the periods. More specifically, if the light-emitting element 100 is turned on at the maximum luminance in both of the periods t1a and t1b, a user of the display apparatus 1 visually recognizes that the light-emitting element 100 is turned on at the brightest luminance over the periods t1a and t1b due to the integral effect of the human eye (the luminance at this time is referred to as luminance A).

By contrast, let us assume a case where the light-emitting element 100 is turned on only in the period t1b out of the periods t1a and t1b. In this case, if the light-emitting element 100 is turned on at the maximum luminance in the period t1b, the luminance is darker than the luminance A when viewed in the entire periods t1a and t1b due to the integral effect in the time-axis direction, and the user visually recognizes that the light-emitting element 100 is turned on at luminance B darker than the luminance A.

Let us assume a case where the light-emitting element 100 is turned on only in the period t1a out of the periods t1a and t1b. In this case, if the light-emitting element 100 is turned on at the maximum luminance in the period t1a, the luminance is darker than the luminance B when viewed in the entire periods t1a and t1b due to the integral effect in the time-axis direction, and the user visually recognizes that the light-emitting element 100 is turned on at luminance C darker than the luminance B. Thus, the time division modulation system changes the luminance according to the length of the lighting period of the light-emitting element 100.

In a period t2 to a period t3 overlapping the periods t1a and t1b, the video signal writing operations for the second partial display region AAs2 to the fourth partial display region AAs4 are sequentially performed. In periods t2a, t2b, t5a, and t5b, the light-emitting operation for the second partial display region AAs2 is performed in the same manner as in the first partial display region AAs1.

In a period t4, the video signal writing operation for the first partial display region AAs1 is performed in the same manner as in the period t1. The gate potential of the first drive transistor DRT1 changes to the electric potential of the first video signal VSG1-2 by the video signal writing operation in the period t4. The gate potential of the second drive transistor DRT2 changes to the electric potential of the second video signal VSG2-2.

Subsequently, in a period t4a, the first light emission control scanning line PWL1 is turned to the L level, and the second light emission control scanning line PWL2 is turned to the H level by the control signals supplied from the scanning line drive circuit 12 and the light emission control circuit 14. The writing control scanning lines GL1, GL2, . . . , and GL270 in the first partial display region AAs1 are turned to the L level. The operations of the transistors of the second pixel circuit in the period t4a are the same as those in the period t1b described above, and redundant explanation thereof is omitted.

As illustrated in FIG. 5, the period t4a is a period for display by the PWM drive system in the display based on the video signals following the period t4. By contrast, a period t4b is a display period by analog gradation. In the display by analog gradation, the lighting period is fixed to a predetermined period, the pixel signal has an analog potential, the ON state of the gate of the drive transistor is adjusted corresponding to the analog potential, and the electric current flowing from the power supply voltage VDD to the light-emitting element 100 has the magnitude corresponding to the ON state of the gate. As a result, the luminance of the light-emitting element 100 is brightness corresponding to the analog potential of the pixel signal. More specifically, the brightness of the light-emitting element 100 based on the pixel signal with the analog potential has any brightness from a luminance of 0 to a predetermined luminance. In other words, if the period is the PWM drive system period, the light-emitting element emits light only at the maximum luminance or a luminance of 0 in the entire period. In the display period by analog gradation, however, the light-emitting element emits light at any luminance between a luminance of 0 and the maximum luminance by gradation expression with the analog potential. In the following description, display by analog gradation may be referred to as the analog drive system.

The pixel signal supplied to the pixel circuit in the display period by the analog drive system can be set to a value corresponding to what is called 0 to 255 gradations. Considering that the period for expressing the gradation based on the analog potential is 12.5% of the entire lighting period, the luminance expression by the pixel signal according to the present embodiment is approximately 0 to 32 gradations.

In the period t4a, the period (pulse width) in which the second emission control transistor PWT2 is turned on is set to a period for achieving a target luminance level of 25% with respect to the maximum lighting luminance. In the period t4a, no electric current flows from the first drive transistor DRT1 to the light-emitting element 100 because the first light emission control transistor PWT1 of the first pixel circuit 50a is turned off.

Subsequently, in the period t4b, the first light emission control scanning line PWL1 is turned to the H level, and the second light emission control scanning line PWL2 is turned to the L level by the control signals supplied from the scanning line drive circuit 12 and the light emission control circuit 14. The writing control scanning lines GL1, GL2, . . . , and GL270 in the first partial display region AAs1 are maintained at the L level. The operations of the transistors of the first pixel circuit 50a in the period t4b are the same as those in the period t1a described above, and redundant explanation thereof is omitted.

In the period t4b, the first drive transistor DRT1 supplies an electric current (first drive current) corresponding to the first video signal VSG1-2 serving as an analog signal to the light-emitting element 100. The period (pulse width) in which the first emission control transistor PWT1 is turned on is fixed to a period for achieving a target luminance level of 12.5% with respect to the maximum lighting luminance. The electric potential of the first video signal VSG1-2 in the period t4b is set for each sub-pixel SPX by the drive signal controller 200. In the period t4b, no electric current flows from the second drive transistor DRT2 to the light-emitting element 100 because the second light emission control transistor PWT2 of the second pixel circuit 50b is turned off.

When the operations described above are completed in the second partial display region AAs2 to the fourth partial display region AAs4, an image of one frame is displayed.

The drive signal controller 200 (refer to FIG. 3) can control the luminance (gradation) of the light-emitting element 100 by the total of the light-emitting operation periods of the periods t1a and t1b and the periods t4a and t4b. More specifically, 87.5% of the luminance of the optical element is achieved in the display period by the PWM drive system based on the video signals with the digital potential (the first video signal VSG1-1 and the second video signals VSG2-1 and VSG2-2). The remaining 12.5% of the luminance is achieved by the video signals with the analog potential (first video signal VSG1-2). The brightness of 12.5% of the luminance can be more finely set according to the analog potential. Therefore, significantly fine gradation expression can be achieved by combining the PWM drive system period and the analog drive system period.

In the example illustrated in FIG. 5, an electric current flows to the light-emitting element 100 in the entire period of the periods t1a and t1b and the periods t4a and t4b to display 100% of the luminance. The drive signal controller 200 (refer to FIG. 3), however, controls turning on/off the lighting in the periods t1a and t1b and the period t4a, thereby supplying a fixed current to the light-emitting element 100 for a period with the length corresponding to the video signal VSG. In addition, the drive signal controller 200 adjusts the electric current (first video signal VSG1-2) in the period t4b, thereby appropriately controlling the luminance (gradation).

Figure 6:
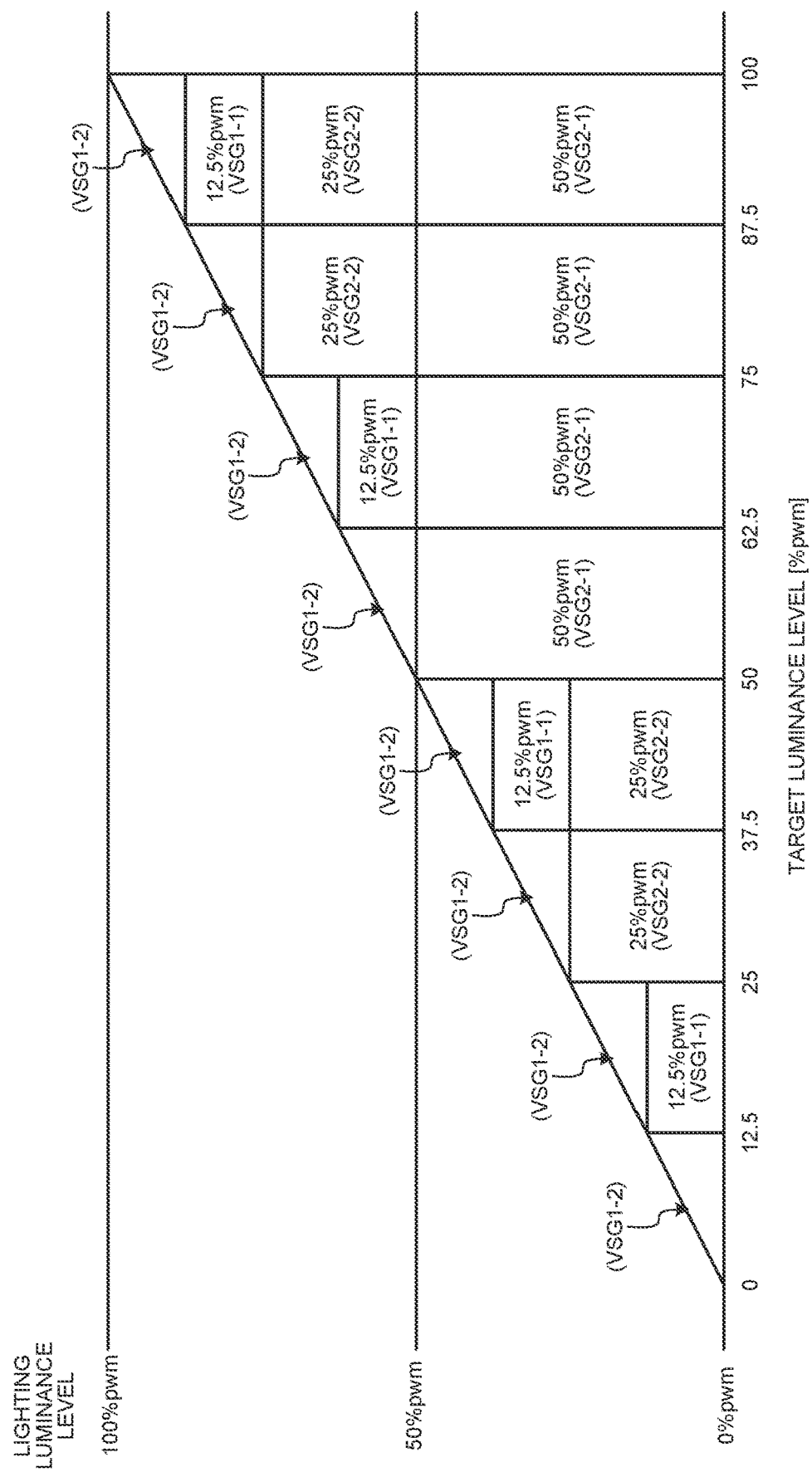
FIG. 6 is a diagram for explaining an example of a combination of a current drive system and a PWM drive system for each display luminance level.

FIG. 6 is a diagram for explaining an example of the combination of the current drive system and the PWM drive system for each display luminance level. As illustrated in FIG. 6, in the range where the target luminance level is larger than 0% and equal to or smaller than 12.5%, the drive signal controller 200 turns on the first light emission control transistor PWT1 in the period t4b and supplies the electric current (first video signal VSG1-2) to the light-emitting element 100 to adjust the lighting luminance level. In other words, the drive signal controller 200 turns off the first light emission control transistor PWT1 and the second light emission control transistor PWT2 in the periods t1a and t1b and the period t4a. In other words, the light-emitting element 100 is turned off in all the periods t1a, t1b, and t4a.

In the range where the target luminance level is larger than 12.5% and equal to or smaller than 25%, the drive signal controller 200 turns on the first light emission control transistor PWT1 in the period t1a and supplies the electric current (first video signal VSG1-1) to the light-emitting element 100 for a period with the length corresponding to a target luminance level of 12.5%. The drive signal controller 200 turns on the first light emission control transistor PWT1 in the period t4b and supplies the electric current (first video signal VSG1-2) to the light-emitting element 100 to adjust the lighting luminance level in the range from 12.5% to 25%. In other words, the drive signal controller 200 turns off the first light emission control transistor PWT1 and the second light emission control transistor PWT2 in the period t1*b* and the period t4*a*. In other words, the light-emitting element 100 is turned off in both the periods t1*b* and t4*a*.

In the range where the target luminance level is larger than 25% and equal to or smaller than 37.5%, the drive signal controller 200 turns on the second light emission control transistor PWT2 in the period t4*a* and supplies the electric current (second video signal VSG2-2) to the light-emitting element 100 for a period with the length corresponding to a target luminance level of 25%. The drive signal controller 200 turns on the first light emission control transistor PWT1 in the period t4*b* and supplies the electric current (first video signal VSG1-2) to the light-emitting element 100 to adjust the lighting luminance level in the range from 25% to 37.5%. In other words, the drive signal controller 200 turns off the first light emission control transistor PWT1 and the second light emission control transistor PWT2 in the period t1*a* and the period t1*b*. In other words, the light-emitting element 100 is turned off in both the periods t1*a* and t1*b*.

In the range where the target luminance level is larger than 37.5% and equal to or smaller than 50%, the drive signal controller 200 turns on the first light emission control transistor PWT1 and the second light emission control transistor PWT2 in the periods t1*a* and t4*a*, respectively, and supplies the electric current (the first video signal VSG1-1 and the second video signal VSG2-2) to the light-emitting element 100 for a period with the length corresponding to a target luminance level of 12.5% and a period with the length corresponding to a target luminance level of 25%. The drive signal controller 200 turns on the first light emission control transistor PWT1 in the period t4*b* and supplies the electric current (first video signal VSG1-2) to the light-emitting element 100 to adjust the lighting luminance level in the range from 37.5% to 50%. In other words, the drive signal controller 200 turns off the first light emission control transistor PWT1 and the second light emission control transistor PWT2 in the period t1*b*. In other words, the light-emitting element 100 is turned off in the period t1*b*.

In the same manner as described above, the drive signal controller 200 combines the electric current (the first video signal VSG1-1 and the second video signals VSG2-1 and VSG2-2) and the electric current (the first video signal VSG1-2), thereby achieving display of the lighting luminance level.

As described above, the display apparatus 1 includes a plurality of light-emitting elements 100, a first pixel circuit 50*a* and a second pixel circuit 50*b*, a first drive transistor DRT1, a second drive transistor DRT2, and a drive circuit (signal line drive circuit 13). The light-emitting elements 100 are arrayed in the display region AA. The first pixel circuit 50*a* and the second pixel circuit are coupled to each of the light-emitting elements 100. The first drive transistor DRT1 is provided to the first pixel circuit 50*a* and supplies the first drive current (electric current corresponding to the first video signal VSG1-2) to the light-emitting element 100. The second drive transistor DRT2 is provided to the second pixel circuit 50*b* and supplies the second drive current (e.g., the electric current corresponding to the second video signal VSG2-2) to the light-emitting element 100. The drive circuit supplies the video signal VSG to the first drive transistor DRT1 and the second drive transistor DRT2.

In the display apparatus 1, the first drive transistor DRT1 provided to the first pixel circuit 50*a* supplies the first drive current (electric current corresponding to the first video signal VSG1-2) set corresponding to the video signal VSG to the light-emitting element 100. The second drive transistor DRT2 provided to the second pixel circuit supplies the fixed second drive current (e.g., a fixed current corresponding to the second video signals VSG2-1 and VSG2-2) to the light-emitting element 100 for a period (periods t1*b* and t4*a*) with the length corresponding to the video signal VSG.

With this configuration, the display apparatus 1 can suitably perform gradation control by combining the PWM drive system that expresses the gradation by combining the periods t1*a*, t1*b*, and t4*a* having different light emission periods and the analog drive system that expresses the gradation by controlling the amount of electric current (first video signal VSG1-2) to the light-emitting element 100 in the period t4*a*.

In the display apparatus 1, the light-emitting element 100 is driven by the first drive current in the range equal to or smaller than the maximum low gradation value defined by the maximum value of the first drive current (electric current corresponding to the first video signal VSG1-2) (e.g., the range equal to or smaller than a target luminance level of 12.5% in FIG. 6). In the range on the high gradation side larger than the maximum gradation value defined by the maximum value of the first drive current (e.g., the range larger than a target luminance level of 12.5% in FIG. 6), the light-emitting element 100 is driven by at least the second drive current (e.g., at least one or more of the electric currents corresponding to the first video signal VSG1-1 and the second video signals VSG2-1 and VSG2-2).

With this mechanism, the gradation control range can be made smaller than in a case where all the gradations are controlled by the current drive system. The current value of the PWM drive system according to the present embodiment is larger than that of the current drive system on the high gradation side. Therefore, the present embodiment can suppress changes in light emission chromaticity due to fluctuations in current value.

In the display apparatus 1, the first drive transistor DRT1 and the second drive transistor DRT2 are supplied with the video signals VSG in a common writing period (e.g., the period t1). The first drive transistor DRT1 and the second drive transistor DRT2 supply the first drive current (electric current corresponding to the first video signal VSG1-2) and the second drive current (e.g., the electric current corresponding to the second video signals VSG2-1 and VSG2-2) to the light-emitting element 100 in a time-division manner.

In the display apparatus 1, two pixel circuits of the first pixel circuit 50*a* and the second pixel circuit 50*b* are provided for one light-emitting element 100. With this configuration, the display apparatus 1 can perform the video signal writing operation on the first pixel circuit 50*a* and the second pixel circuit 50*b* in the same writing period (e.g., the period t1). Therefore, the display apparatus 1 can reduce the time required for the video signal writing operation compared with a case where multi-gradation display is performed by one pixel circuit.

The pixel circuit 50 and the driving method illustrated in FIGS. 4 to 6 are given by way of example only and can be appropriately modified. While the display apparatus 1 combines the three periods (pulse widths) t1*a*, t1*b*, and t2*a* having different lengths to implement the PWM drive system, the present embodiment is not limited thereto. The display apparatus 1 may combine two different periods (pulse widths) or four or more different periods (pulse widths), for example, to implement the PWM drive system.

As illustrated in FIG. 5, the display period by the PWM drive system is longer in the first pixel circuit 50*a* than in the second pixel circuit 50*b*. Therefore, the holding capacitance Cs1 may be larger than the holding capacitance Cs2.

Modifications of the First Embodiment

Figure 7:
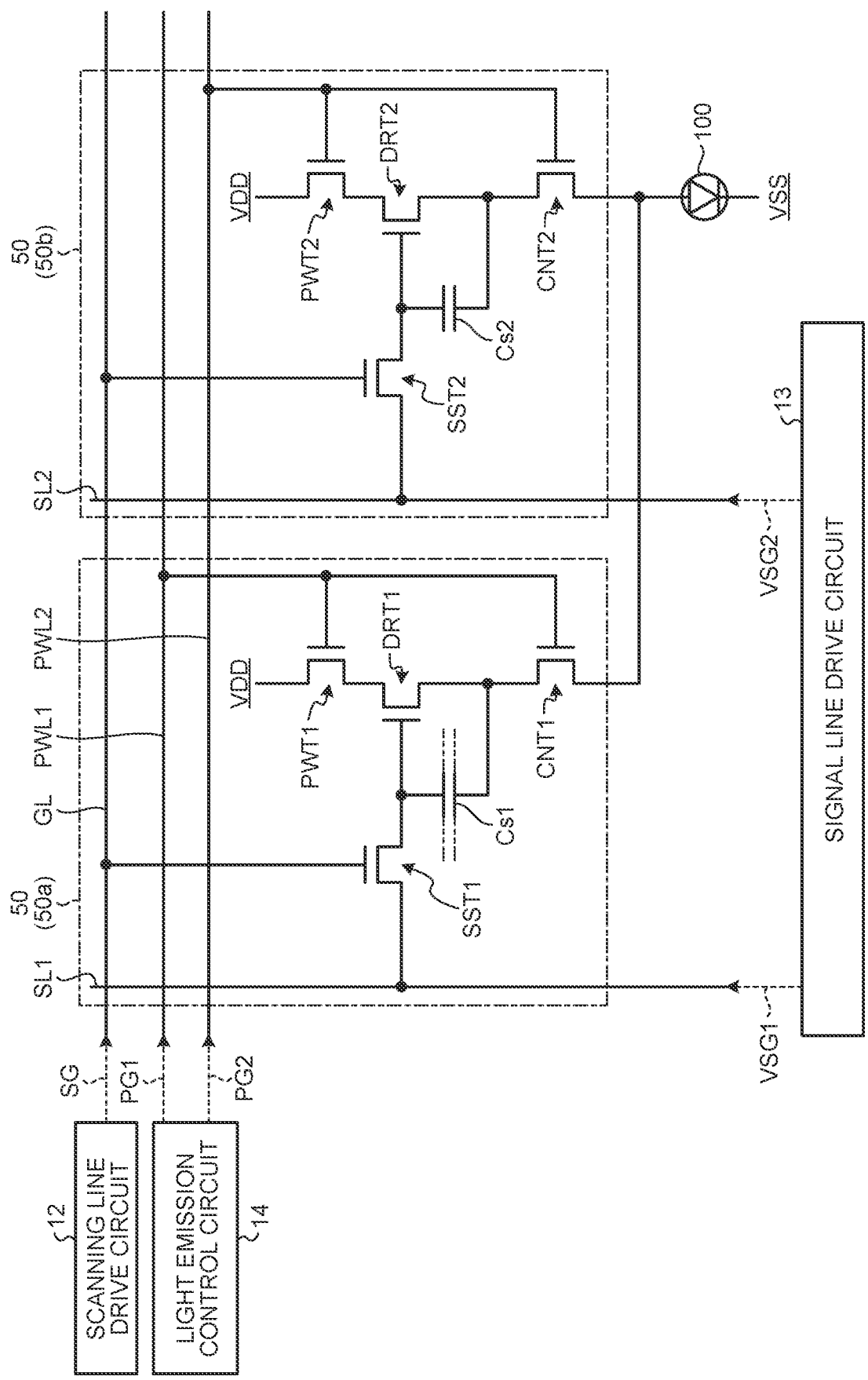
FIG. 7 is a circuit diagram of an exemplary configuration of the pixel circuit according to a modification of the first embodiment.

FIG. 7 is a circuit diagram of an exemplary configuration of the pixel circuit according to a modification of the first embodiment. In the following description, the same components as those described in the embodiment above are denoted by like reference numerals, and overlapping explanation thereof is omitted.

As illustrated in FIG. 7, in the first pixel circuit according to the modification, the gate of the first coupling switching transistor CNT1 is coupled to the first light emission control scanning line PWL1. In other words, the first coupling switching transistor CNT1 is supplied with the same first light emission control signal PG1 as that for the first light emission control transistor PWT1. The first coupling switching transistor CNT1 and the first light emission control transistor PWT1 are n-type TFTs. With this configuration, the first coupling switching transistor CNT1 is controlled to be turned on and off in synchronization with the first light emission control transistor PWT1.

Also in the second pixel circuit 50b, the gate of the second coupling switching transistor CNT2 is coupled to the second light emission control scanning line PWL2. In other words, the second coupling switching transistor CNT2 is supplied with the same second light emission control signal PG2 as that for the second light emission control transistor PWT2. The second coupling switching transistor CNT2 and the second light emission control transistor PWT2 are n-type TFTs. With this configuration, the second coupling switching transistor CNT2 is controlled to be turned on and off in synchronization with the second light emission control transistor PWT2.

Second Embodiment

Figure 8:
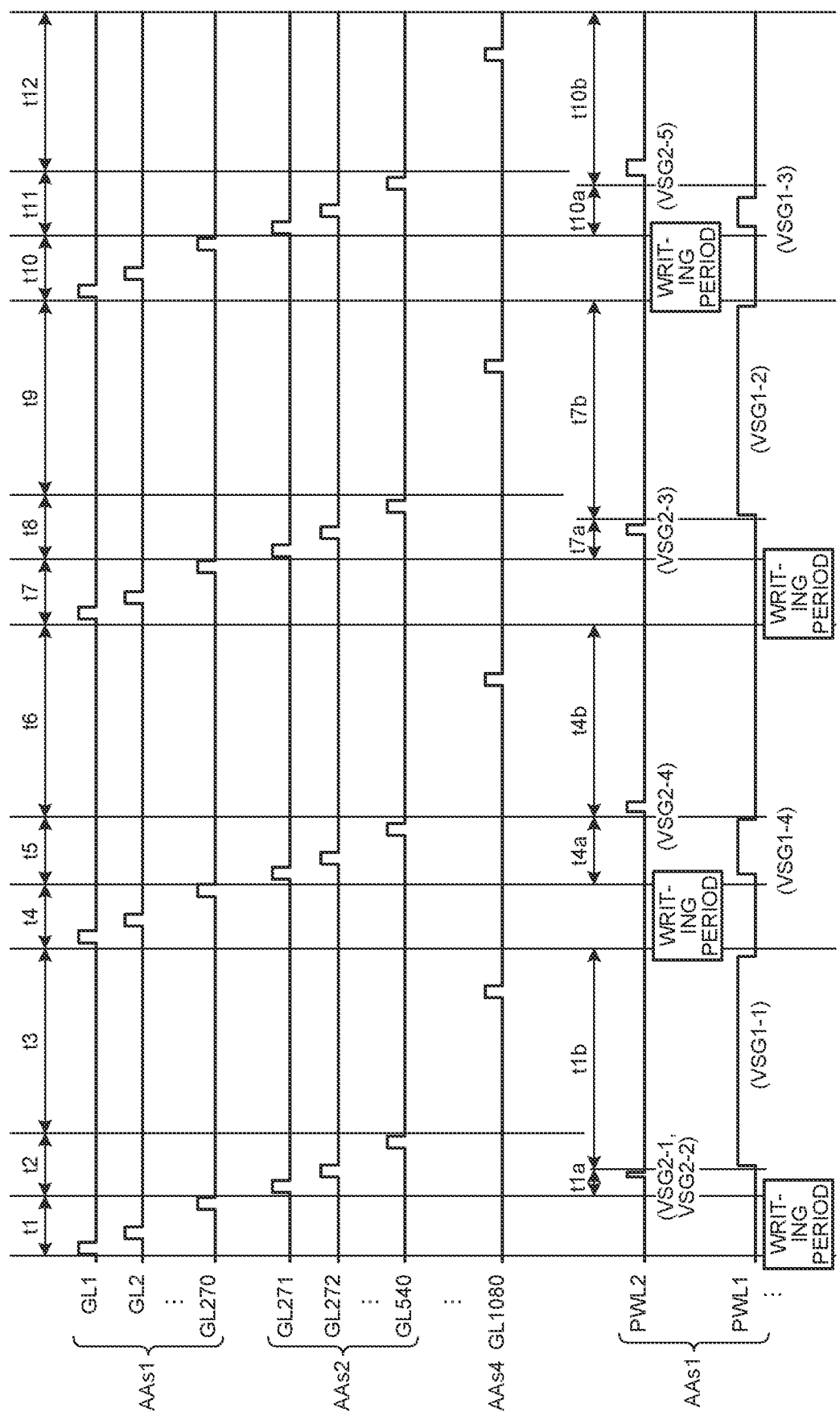
FIG. 8 is a timing chart for explaining an example of the operations performed by the display apparatus according to a second embodiment.
Figure 9:
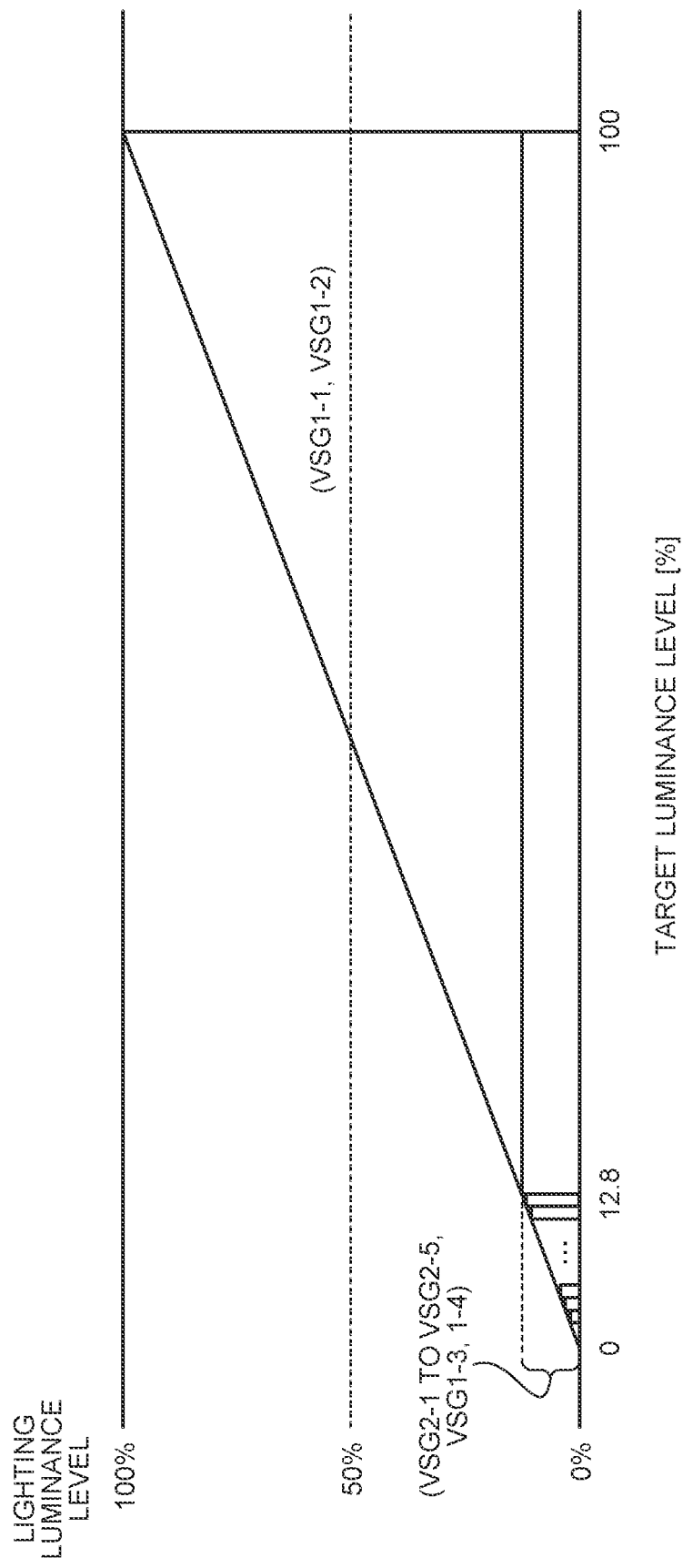
FIG. 9 is a diagram for explaining an example of the combination of the current drive system and the PWM drive system for each display luminance level of the display apparatus according to the second embodiment.
Figure 10:
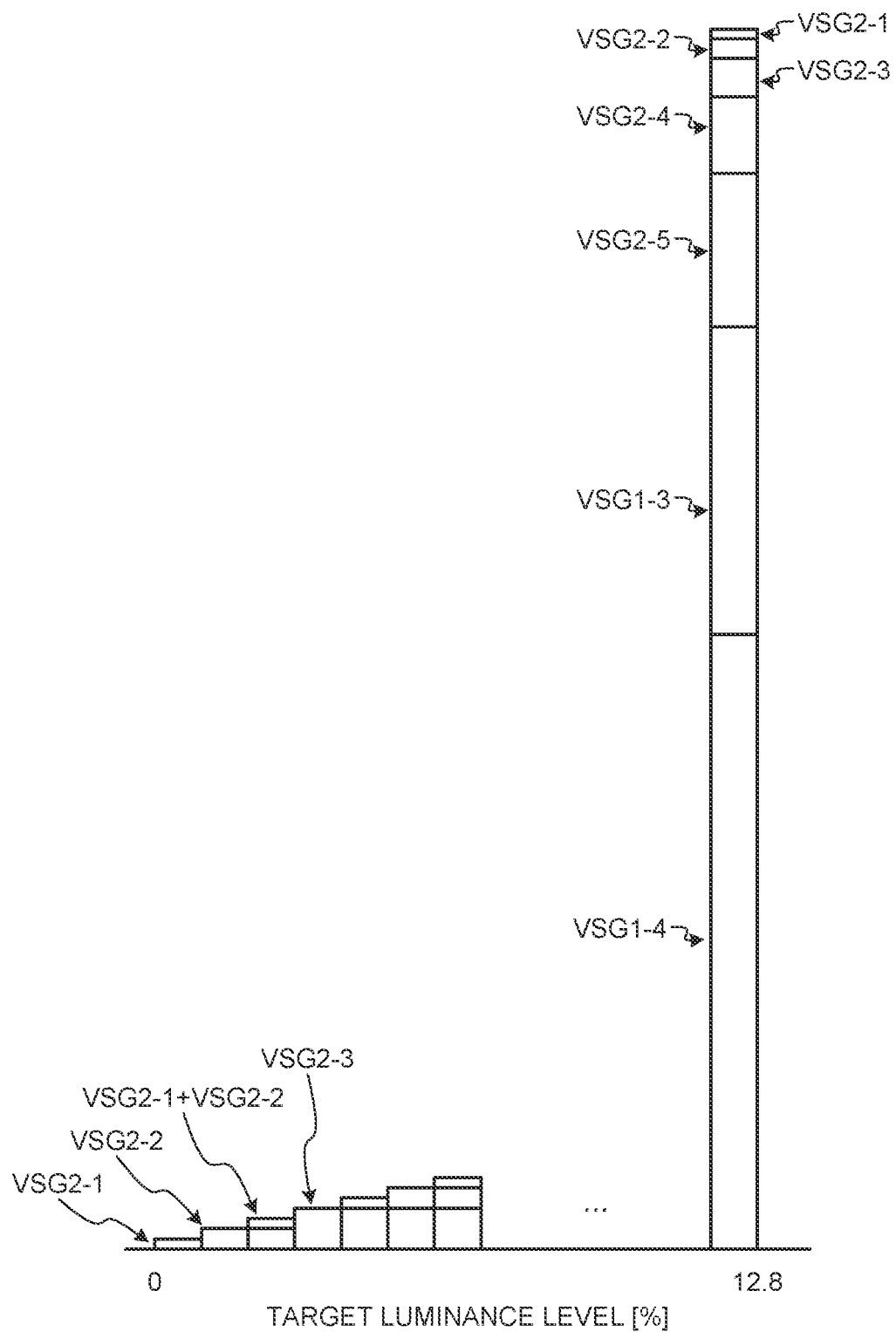
FIG. 10 is an enlarged explanatory diagram schematically illustrating the range of target luminance levels of 0% to 12.8% in FIG. 9.

FIG. 8 is a timing chart for explaining an example of the operations performed by the display apparatus according to a second embodiment. FIG. 9 is a diagram for explaining an example of the combination of the current drive system and the PWM drive system for each display luminance level of the display apparatus according to the second embodiment. FIG. 10 is an enlarged explanatory diagram schematically illustrating the range of target luminance levels of 0% to 12.8% in FIG. 9.

In the range on the low gradation side, the display apparatus 1 according to the second embodiment drives the light-emitting element 100 by the PWM drive system that expresses the gradation by controlling the lighting time. In the range on the high gradation side, the display apparatus 1 drives the light-emitting element 100 by combining the PWM drive system and the current drive system that expresses the gradation by controlling the electric current (first video signals VSG1-1 and VSG1-2).

As illustrated in FIG. 8, the periods t1, t4, t7, and t10 are the video signal writing operation periods for the first partial display region AAs1. In the period t1a, the second light emission control transistor PWT2 of the second pixel circuit 50b is turned on, and the second drive transistor DRT2 supplies the electric current (second drive current) corresponding to the second video signals VSG2-1 and VSG2-2 to the light-emitting element 100. In the period t1a, the period (pulse width) in which the second light emission control transistor PWT2 is turned on is set to a period for achieving a target luminance level of 0.2% (second video signal VSG2-1) or 0.4% (second video signal VSG2-2), for example, with respect to the maximum lighting luminance. The second video signal VSG2-1 and the second video signal VSG2-2 are alternately switched and each turn on the light-emitting element 100 once every two times. As a result, their contribution to the display luminance is 0.1% and 0.2%, respectively. This control system can increase the number of gradations because the pulses with low luminance do not cause flicker even if the turning-on/-off frequency is small.

In the period t1b, the first light emission control transistor PWT1 of the first pixel circuit 50a is turned on, and the first drive transistor DRT1 supplies the electric current (first drive current) corresponding to the first video signal VSG1-1 to the light-emitting element 100. In the period t1b, the period (pulse width) in which the first light emission control transistor PWT1 is turned on is set to a period for achieving a luminance level of approximately one half of the luminance range allocated to the current drive system. More specifically, the pulses in the periods t1b and t7b are set to 43.6%. As a result, the total of the pulses in the two periods t1b and t7b is 87.2% (=100%−12.8%). In contrast to the period t1a, the lighting is controlled two separate times because the luminance is high, and flicker is more likely to occur.

In the period t4a, the first light emission control transistor PWT1 of the first pixel circuit 50a is turned on, and the first drive transistor DRT1 supplies the electric current (second drive current) corresponding to the first video signal VSG1-4 to the light-emitting element 100. In the period t4a, the period (pulse width) in which the first emission control transistor PWT1 is turned on is set to a period for achieving a target luminance level of 6.4%, for example, with respect to the maximum lighting luminance.

In the period t4b, the second light emission control transistor PWT2 of the second pixel circuit 50b is turned on, and the second drive transistor DRT2 supplies the electric current (second drive current) corresponding to the second video signal VSG2-4 to the light-emitting element 100. In the period t4b, the period (pulse width) in which the second emission control transistor PWT2 is turned on is set to a period for achieving a target luminance level of 0.8%, for example, with respect to the maximum lighting luminance.

In the period t7a, the second light emission control transistor PWT2 of the second pixel circuit 50b is turned on, and the second drive transistor DRT2 supplies the electric current (second drive current) corresponding to the second video signal VSG2-3 to the light-emitting element 100. In the period t7a, the period (pulse width) in which the second emission control transistor PWT2 is turned on is set to a period for achieving a target luminance level of 0.4%, for example, with respect to the maximum lighting luminance.

In the period t7b, the first light emission control transistor PWT1 of the first pixel circuit 50a is turned on, and the first drive transistor DRT1 supplies the electric current (first drive current) corresponding to the first video signal VSG1-2 to the light-emitting element 100. In the period t7b, the period (pulse width) in which the first light emission control transistor PWT1 is turned on is set to a period for achieving a luminance level of approximately one half of the luminance range assigned to the current drive system.

In the period t10a, the first light emission control transistor PWT1 of the first pixel circuit 50a is turned on, and the first drive transistor DRT1 supplies the electric current (second drive current) corresponding to the first video signal VSG1-3 to the light-emitting element 100. In the period t10a, the period (pulse width) in which the first emission control transistor PWT1 is turned on is set to a period for achieving a target luminance level of 3.2%, for example, with respect to the maximum lighting luminance.

In the period t10b, the second light emission control transistor PWT2 of the second pixel circuit 50b is turned on, and the second drive transistor DRT2 supplies the electric current (second drive current) corresponding to the second video signal VSG2-5 to the light-emitting element 100. In the period t10b, the period (pulse width) in which the second emission control transistor PWT2 is turned on is set to a period for achieving a target luminance level of 1.6%, for example, with respect to the maximum lighting luminance.

The display apparatus 1 according to the second embodiment controls the combination of the periods t1a, t4a, t4b, t7a, t10a, and t10b so as to achieve the lighting time corresponding to the video signals VSG on the low gradation side. Thus, the display apparatus 1 supplies the electric current (the first video signals VSG1-3 and VSG1-4 and the second video signals VSG2-1, VSG2-2, VSG2-3, VSG2-4, and VSG2-5) to the light-emitting element 100 to express the gradation. In the range on the high gradation side, the display apparatus 1 drives the light-emitting element 100 by combining the PWM drive system and the current drive system that expresses the gradation by controlling the electric current (first video signals VSG1-1 and VSG1-2).

As illustrated in FIGS. 9 and 10, in the range where the target luminance level is larger than 0% and equal to and smaller than 12.8%, the drive signal controller 200 adjusts the lighting luminance level by combining the electric currents (the first video signals VSG1-3 and VSG1-4 and the second video signals VSG2-1, VSG2-2, VSG2-3, VSG2-4, and VSG2-5). In other words, the drive signal controller 200 turns off the first light emission control transistor PWT1 and the second light emission control transistor PWT2 in the periods t1b and t7b in the range on the low gradation side.

As illustrated in FIG. 9, in the range where the target luminance level is larger than 12.8% and equal to or smaller than 100%, the drive signal controller 200 turns on the first light emission control transistor PWT1 in at least one of the periods t1b and t7b to supply the electric current (first video signals VSG1-1 and VSG1-2) to the light-emitting element 100. In the range larger than 12.8% and equal to or smaller than 100%, the drive signal controller 200 supplies all the electric currents (the first video signals VSG1-3 and VSG1-4 and the second video signals VSG2-1, VSG2-2, VSG2-3, VSG2-4, and VSG2-5) to the light-emitting element 100. In other words, the drive signal controller 200 adjusts the lighting luminance level by combining the PWM drive system and the current drive system in the range on the high gradation side.

In some of the light-emitting elements 100, the degree of color change may possibly increase when the current value is small, thereby making changes in light emission chromaticity more likely to occur. The second embodiment employs the PWM drive system that expresses the gradation by controlling the lighting time with the electric current on the low gradation side. Therefore, the second embodiment can supply, although for a short period, a stable current to the optical element on the low gradation side, thereby suppressing changes in light emission chromaticity.

In the periods t1b and t7b, the second embodiment achieves the lighting luminance level by the total of the electric currents corresponding to the two first video signals VSG1-1 and VSG1-2. The present embodiment is not limited thereto and may achieve the lighting luminance level by the electric current corresponding to one first video signal VSG1. The resolution of the lighting luminance level on the low gradation side can be appropriately modified. The number of currents (the first video signals VSG1-3 and VSG1-4 and the second video signals VSG2-1, VSG2-2, VSG2-3, VSG2-4, and VSG2-5) and the period (pulse width) can also be modified depending on the resolution of the lighting luminance level.

While the display apparatus 1 described above is an organic EL display apparatus including OLEDs as the light-emitting elements, it is not limited thereto. The display apparatus 1 may be an inorganic EL display apparatus including micro LEDs or mini LEDs as the light-emitting elements.

While exemplary embodiments according to the present invention have been described, the embodiments are not intended to limit the invention. The contents disclosed in the embodiments are given by way of example only, and various modifications may be made without departing from the spirit of the present invention. Appropriate modifications made without departing from the spirit of the present invention naturally fall within the technical scope of the invention. At least one of various omissions, substitutions, and modifications of the components may be made without departing from the gist of the embodiments above and the modification thereof.

What is claimed is:

1. A display apparatus comprising:
a light-emitting element;
a first pixel circuit and a second pixel circuit coupled to the light-emitting element;
a first drive transistor included in the first pixel circuit and configured to supply a first drive current to the light-emitting element;
a second drive transistor included in the second pixel circuit and configured to supply a second drive current to the light-emitting element; and
a drive circuit configured to supply a first video signal to the first drive transistor and to supply a second video signal to the second drive transistor,
wherein
the first drive transistor is supplied with the first video signal and the second drive transistor is supplied with the second video signal in a same writing period,
the first drive transistor supplies the first drive current to the light-emitting element and the second drive transistor supplies the second drive current to the light-emitting element in a time-division manner,
the first drive transistor supplies the first drive current set corresponding to the first video signal to the light-emitting element,
the second drive transistor supplies the second drive current that is fixed to the light-emitting element,
a control circuit sets a light emission period by the first pixel circuit to a predetermined period and changes a light emission period by the second pixel circuit,
the first drive current is supplied to the light-emitting element, and the second drive current is not supplied to the light-emitting element when displaying a gradation of equal to or smaller than the maximum gradation value defined by the maximum value of the first drive current, and
at least the second drive current out of the first drive current and the second drive current is supplied to the light-emitting element when displaying a gradation of larger than the maximum gradation value defined by the maximum value of the first drive current.

2. The display apparatus according to claim 1, wherein the light-emitting element is driven by the second drive current, and the first drive current is not supplied to the light-emitting element when displaying a gradation of equal to or smaller than the maximum gradation value defined by the fixed second drive current and the light emission period by the second pixel circuit, and the light-emitting element is driven by the first drive current and the second drive current when displaying a gradation of larger than the maximum gradation value defined by the fixed second drive current and the light emission period by the second pixel circuit.

3. The display apparatus according to claim 1, further comprising:
a first writing transistor coupled to a gate of the first drive transistor and configured to supply the first video signal to the first drive transistor; and
a second writing transistor coupled to a gate of the second drive transistor and configured to supply the second video signal to the second drive transistor, wherein
a gate of the first writing transistor and a gate of the second writing transistor are coupled to a common wiring control scanning line.

4. The display apparatus according to claim 1, further comprising:
a first light emission control transistor coupled to the first drive transistor;
a first light emission control scanning line coupled to a gate of the first light emission control transistor;
a second light emission control transistor coupled to the second drive transistor;
a second light emission control scanning line coupled to a gate of the second light emission control transistor;
a first coupling switching transistor provided between the first drive transistor and the light-emitting element; and
a second coupling switching transistor provided between the second drive transistor and the light-emitting element, wherein
a gate of the first coupling switching transistor is coupled to the second light emission control scanning line, and
a gate of the second coupling switching transistor is coupled to the first light emission control scanning line.

5. The display apparatus according to claim 1, further comprising:
a first light emission control transistor coupled to the first drive transistor;
a first light emission control scanning line coupled to a gate of the first light emission control transistor; and
a first coupling switching transistor provided between the first drive transistor and the light-emitting element, wherein
a gate of the first coupling switching transistor is coupled to the first light emission control scanning line.

6. The display apparatus according to claim 1, wherein
the first drive transistor further supplies a fixed drive current similar to the second drive current to the light-emitting element as the first drive current, and
the control circuit further sets a light emission period due to the fixed drive current.

7. A display apparatus comprising:
a light-emitting element;
a first pixel circuit and a second pixel circuit coupled to the light-emitting element;
a first drive transistor included in the first pixel circuit and configured to supply a first drive current to the light-emitting element;
a second drive transistor included in the second pixel circuit and configured to supply a second drive current to the light-emitting element;
a first light emission control transistor coupled to the first drive transistor;
a first light emission control scanning line coupled to a gate of the first light emission control transistor;
a first coupling switching transistor provided between the first drive transistor and the light-emitting element;
a second light emission control transistor coupled to the second drive transistor;
a second light emission control scanning line coupled to a gate of the second light emission control transistor; and
a drive circuit configured to supply a first video signal to the first drive transistor and to supply a second video signal to the second drive transistor, wherein
a gate of the first coupling switching transistor is coupled to one of the first light emission control scanning line and the second light emission control scanning line.

8. The display apparatus according to claim 7, further comprising:
a second coupling switching transistor provided between the second drive transistor and the light-emitting element, wherein
the gate of the first coupling switching transistor is coupled to the second light emission control scanning line, and
a gate of the second coupling switching transistor is coupled to the first light emission control scanning line.

9. The display apparatus according to claim 7, wherein
the first drive transistor is supplied with the first video signal and the second drive transistor is supplied with the second video signal in a same writing period, and
the first drive transistor supplies the first drive current to the light-emitting element and the second drive transistor supplies the second drive current to the light-emitting element in a time-division manner.

10. The display apparatus according to claim 7, wherein
the first drive transistor supplies the first drive current set corresponding to the first video signal to the light-emitting element,
the second drive transistor supplies the second drive current that is fixed to the light-emitting element, and
a control circuit sets a light emission period by the first pixel circuit to a predetermined period and changes a light emission period by the second pixel circuit.

11. The display apparatus according to claim 10, wherein
the first drive current is supplied to the light-emitting element, and the second drive current is not supplied to the light-emitting element when displaying a gradation of equal to or smaller than the maximum gradation value defined by the maximum value of the first drive current, and
at least the second drive current out of the first drive current and the second drive current is supplied to the light-emitting element when displaying a gradation of larger than the maximum gradation value defined by the maximum value of the first drive current.

12. The display apparatus according to claim 10, wherein
the light-emitting element is driven by the second drive current, and the first drive current is not supplied to the light-emitting element when displaying a gradation of equal to or smaller than the maximum gradation value defined by the fixed second drive current and the light emission period by the second pixel circuit, and
the light-emitting element is driven by the first drive current and the second drive current when displaying a gradation of larger than the maximum gradation value defined by the fixed second drive current and the light emission period by the second pixel circuit.

13. A display apparatus comprising:
a light-emitting element;
a first pixel circuit and a second pixel circuit coupled to the light-emitting element;
a first drive transistor included in the first pixel circuit and configured to supply a first drive current to the light-emitting element;
a second drive transistor included in the second pixel circuit and configured to supply a second drive current to the light-emitting element; and
a drive circuit configured to supply a first video signal to the first drive transistor and to supply a second video signal to the second drive transistor, wherein
the first drive current changes depending on a gray level of the first video signal,
the second drive current is a constant current value,
the first drive current is supplied to the light-emitting element, and the second drive current is not supplied to the light-emitting element when displaying a gray level of equal to or smaller than a maximum gray level value defined by a maximum value of the first drive current, and
at least the second drive current out of the first drive current and the second drive current is supplied to the light-emitting element when displaying a gray level of larger than the maximum gray level value defined by the maximum value of the first drive current.

14. The display apparatus according to claim 13, wherein
a video signal having a predetermined gray level is input to the display apparatus,
the gray level of the first video signal is determined based on the predetermined gray level, and
a light emission period in which the second pixel circuit causes the light-emitting element to emit light is determined based on the predetermined gray level.

15. The display apparatus according to claim 13, wherein the light emission period in which the second pixel circuit causes the light-emitting element to emit light in one frame period includes a first light emission period and a second light emission period.

16. The display apparatus according to claim 15, wherein a length of the first light emission period is different from a length of the second light emission period.

17. The display apparatus according to claim 13, wherein
the first drive transistor is supplied with the first video signal and the second drive transistor is supplied with the second video signal in a same writing period, and
the first drive transistor supplies the first drive current to the light-emitting element and the second drive transistor supplies the second drive current to the light-emitting element in a time-division manner.

* * * * *